(12) United States Patent
Otsubo et al.

(10) Patent No.: US 10,912,188 B2
(45) Date of Patent: Feb. 2, 2021

(54) HIGH-FREQUENCY COMPONENT

(71) Applicant: Murata Manufacturing Co., Ltd., Kyoto (JP)

(72) Inventors: Yoshihito Otsubo, Kyoto (JP); Norio Sakai, Kyoto (JP); Tetsuya Kanagawa, Kyoto (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 903 days.

(21) Appl. No.: 15/464,851

(22) Filed: Mar. 21, 2017

(65) Prior Publication Data
US 2017/0231085 A1 Aug. 10, 2017

Related U.S. Application Data

(63) Continuation of application No. PCT/JP2015/073098, filed on Aug. 18, 2015.

(30) Foreign Application Priority Data

Sep. 26, 2014 (JP) .................................. 2014-196040

(51) Int. Cl.
*H01F 5/00* (2006.01)
*H05K 1/02* (2006.01)
(Continued)

(52) U.S. Cl.
CPC ........... *H05K 1/0243* (2013.01); *H01F 17/04* (2013.01); *H01F 27/255* (2013.01);
(Continued)

(58) Field of Classification Search
USPC ......................................................... 336/200
See application file for complete search history.

(56) References Cited

U.S. PATENT DOCUMENTS

| | | | | |
|---|---|---|---|---|
| 6,188,295 B1 * | 2/2001 | Tsai | .................... | H05K 1/16 331/108 D |
| 9,048,112 B2 * | 6/2015 | Pan | .................... | H01L 23/49822 |

(Continued)

FOREIGN PATENT DOCUMENTS

| | | |
|---|---|---|
| JP | S55-169814 U | 12/1980 |
| JP | H02-63568 U | 5/1990 |

(Continued)

OTHER PUBLICATIONS

Notice of Reasons for Rejection for Japanese Patent Application No. 2016-550034, dated Dec. 12, 2017.

(Continued)

*Primary Examiner* — Ronald Hinson
(74) *Attorney, Agent, or Firm* — Peame & Gordon LLP

(57) ABSTRACT

A high-frequency component includes a resin layer and a high-frequency circuit provided in and on the resin layer and includes an inductor and an electronic component. The electronic component is arranged on an upper surface of the resin layer. The inductor includes first and second metal pins provided such that upper end surfaces thereof are exposed from the upper surface of the resin layer and lower end surfaces thereof are exposed from a lower surface of the resin layer. The electronic component has a first outer (Continued)

electrode provided at a position superposed with the upper end surface of the first metal pin in plan view and is connected to the first metal pin, and a second outer electrode provided at a position superposed with the upper end surface of the second metal pin in plan view and is connected to the second metal pin.

5 Claims, 13 Drawing Sheets

(51) Int. Cl.
    *H01F 27/40*     (2006.01)
    *H01F 17/04*     (2006.01)
    *H05K 1/11*     (2006.01)
    *H01F 27/255*     (2006.01)
    *H01F 27/28*     (2006.01)
    *H05K 1/16*     (2006.01)
    *H05K 1/18*     (2006.01)
    *H05K 3/34*     (2006.01)

(52) U.S. Cl.
    CPC ......... *H01F 27/2823* (2013.01); *H01F 27/40* (2013.01); *H05K 1/113* (2013.01); *H05K 1/165* (2013.01); *H05K 1/181* (2013.01); *H01L 2224/16225* (2013.01); *H01L 2924/0002* (2013.01); *H01L 2924/15173* (2013.01); *H05K 3/3452* (2013.01); *H05K 2201/049* (2013.01); *H05K 2201/0979* (2013.01); *H05K 2201/1003* (2013.01); *H05K 2201/10015* (2013.01); *H05K 2201/10022* (2013.01); *H05K 2201/10378* (2013.01)

(56) References Cited

U.S. PATENT DOCUMENTS

| | | | |
|---|---|---|---|
| 2007/0138614 | A1* | 6/2007 | Harrison ............... H01L 23/552 257/686 |
| 2007/0231958 | A1 | 10/2007 | Akahane |
| 2012/0194304 | A1 | 8/2012 | Muraoka |
| 2014/0292443 | A1 | 10/2014 | Nosaka |

FOREIGN PATENT DOCUMENTS

| | | |
|---|---|---|
| JP | H02-260812 A | 10/1990 |
| JP | H03-215948 A | 9/1991 |
| JP | 2000-223316 A | 8/2000 |
| JP | 2000-277334 A | 10/2000 |
| JP | 2004-320522 A | 11/2004 |
| JP | 2005-183890 A | 7/2005 |
| JP | 2007-266544 A | 10/2007 |
| JP | 2012-156921 A | 8/2012 |
| WO | 2009/090917 A1 | 5/2011 |

OTHER PUBLICATIONS

International Search Report issued in Application No. PCT/JP2015/073098 dated Oct. 6, 2015.
Written Opinion issued in Application No. PCT/JP2015/073098 dated Oct. 6, 2015.

* cited by examiner

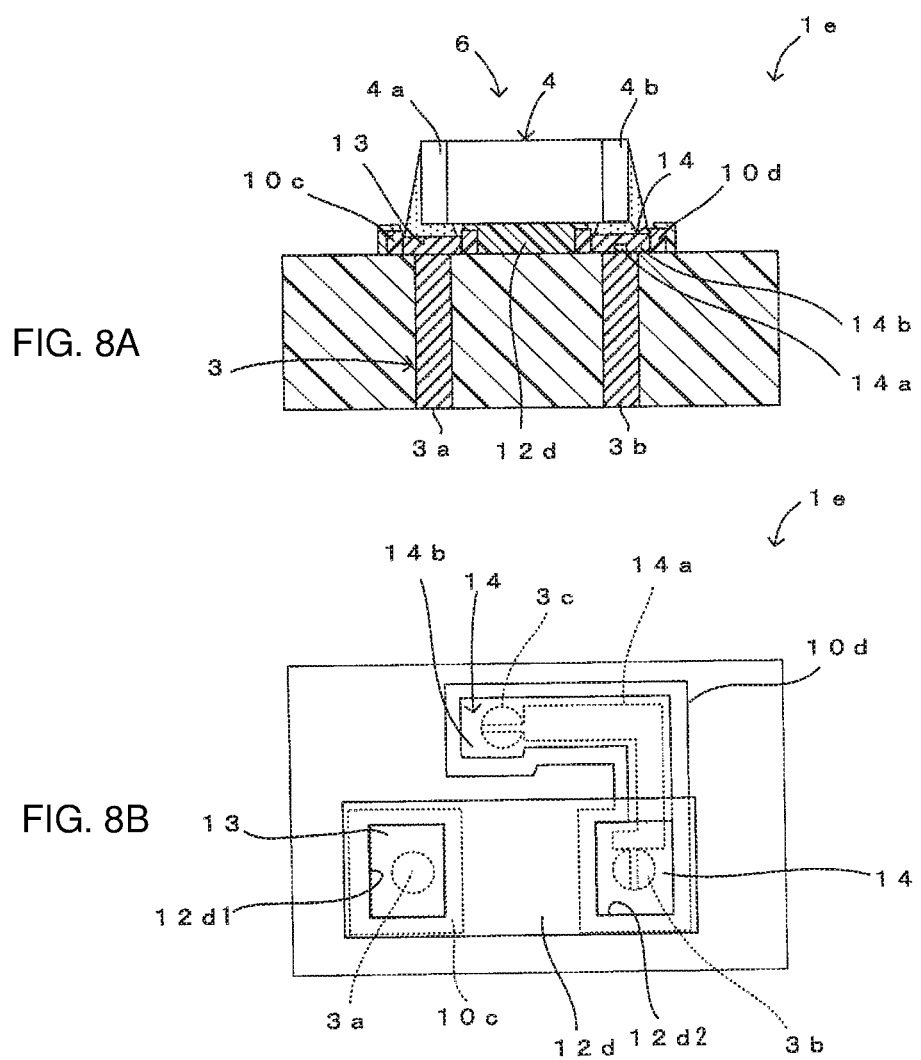

HIGH-FREQUENCY COMPONENT

This is a continuation of International Application No. PCT/JP2015/073098 filed on Aug. 18, 2015 which claims priority from Japanese Patent Application No. 2014-196040 filed on Sep. 26, 2014. The contents of these applications are incorporated herein by reference in their entireties.

BACKGROUND

Technical Field

The present disclosure relates to a high-frequency component in which a high-frequency circuit is provided in or on an insulating layer.

In the related art, a high-frequency component is known in which a high-frequency circuit, which is formed of an inductor or the like, is formed inside insulating layers. For example, as illustrated in FIG. 15, a high-frequency component 100 disclosed in Patent Document 1 is formed by building an inductor 102 into a multilayer substrate 101. Here, the multilayer substrate 101 is formed of a multilayer body composed of a plurality of magnetic layers 101a. In addition, the inductor 102 includes in-plane conductors 103a to 103d, which are formed on first main surfaces of prescribed magnetic layers 101a, and columnar conductors 104a to 104c, which connect the in-plane conductors 103a to 103d to each other between the layers. The inductor 102 is formed as a single conductor inside the multilayer substrate 101. Due to this configuration, the inductor 102 functions as an inductor device.

Patent Document 1: Japanese Unexamined Patent Application Publication No. 2005-183890 (refer to paragraph 0051 and FIG. 5 for example)

BRIEF SUMMARY

When the inductor 102 is built into the multilayer substrate 101, the columnar conductors 104a to 104c are each formed by forming via conductors or through hole conductors in the respective magnetic layers 101a and stacking these conductors on top of one another. Depending on the method used to form the columnar conductors 104a to 104c, the connection areas between adjacent conductors (via conductors or through hole conductors) will decrease due to deviations in stacking of the magnetic layers 101a, and therefore the total resistance value of the columnar conductors 104a to 104c will increase and the resistance value of the inductor 102 will also increase. Furthermore, variations in stacking deviations will cause variations in the resistances values of the inductor 102.

In addition, the functionality of the high-frequency component may be increased by mounting an electronic component such as a chip capacitor on one main surface of the multilayer substrate 101 and using the inductor 102 and the electronic component in combination with each other. With the increasing size reduction of electronic devices in recent years, further size reduction of this type of high-frequency component has also been demanded.

The present disclosure was made in light of the above-described problems and the present disclosure reduces the size of a high-frequency component that includes an inductor and an electronic component while improving the characteristics of the inductor.

A high-frequency component of the present disclosure includes: an insulating layer; and a high-frequency circuit including an inductor and an electronic component that is arranged on one main surface of the insulating layer; wherein the inductor includes a first metal pin that is provided such that one end surface thereof is exposed from the one main surface of the insulating layer and another end surface thereof is exposed from another main surface of the insulating layer, and a second metal pin that is provided such that one end surface thereof is exposed from the one main surface of the insulating layer and another end surface thereof is exposed from the other end surface of the insulating layer, and the electronic component has a first outer electrode that is provided at a position that is superposed with the one end surface of the first metal pin in plan view (viewed in a direction perpendicular to the one main surface of the insulating layer) and is connected to the first metal pin, and a second outer electrode that is provided at a position that is superposed with the one end surface of the second metal pin in plan view and is connected to the second metal pin.

The first and second metal pins are formed by shearing a wire rod that is formed of a metal such as Cu, for example, and therefore the relative resistances thereof are low and variations between the values thereof are small compared with via conductors, which are formed by filling via holes with a conductive paste. Consequently, an inductor can be formed that has excellent coil characteristics (for example, a high Q value) and for which the variations in the characteristics thereof are small.

In addition, the first outer electrode of the electronic component is provided at a position that is superposed with the one end surface of the first metal pin in plan view and the second outer electrode of the electronic component is arranged at a position that is superposed with the one end surface of the second metal pin in plan view. In this case, wiring lines that connect the inductor and the electronic component can be shortened, and therefore the parasitic inductance of the high-frequency circuit can be reduced and the high-frequency component can be reduced in size.

In addition, the inductor may further include a third metal pin that is provided such that one end surface thereof is exposed from the one main surface of the insulating layer and another end surface thereof is exposed from the other main surface of the insulating layer, and a first wiring electrode that is formed on the one main surface of the insulating layer and connects the one end surface of the second metal pin and the one end surface of the third metal pin to each other. In this case, a connection structure that allows the electronic component and inductor to be connected in a variety of ways can be provided.

In addition, the inductor may further include a second wiring electrode that is formed on the one main surface of the insulating layer and connects the one end surface of the first metal pin and the one end surface of the second metal pin to each other, the first outer electrode may be connected to the one end surface of the first metal pin via the second wiring electrode, and the second outer electrode may be connected to the one end surface of the second metal pin via the second wiring electrode. In this case, a high-frequency circuit can be provided in which the inductor and the electronic component are connected in parallel with each other.

In addition, the high-frequency component may include a plurality of the high-frequency circuits, and the high-frequency circuits may be arrayed in a matrix pattern. In this case, an array structure composed of a plurality of high-frequency circuits can be provided in which the coil characteristics of the inductors are excellent and in which variations in the characteristics of the inductors are small.

In addition, the high-frequency component may include: a plurality of the high-frequency circuits, in each of which the electronic component is formed of a chip component having a rectangular shape in plan view; wherein a large number of sets of two adjacent high-frequency circuits may be arrayed in a matrix pattern, and in each set of high-frequency circuits, the two electronic components may be arranged parallel to each other, and the one end surfaces of the two third metal pins may be arranged between the two electronic components. In this case, the one end surfaces of the third metal pins are arranged between the electronic components of the two high-frequency circuits constituting a set and therefore the space between the electronic components can be efficiently used. Consequently, the high-frequency component, which has an array structure consisting of a plurality of high-frequency circuits, can be reduced in size.

According to the present disclosure, the first and second metal pins are formed by shearing a wire rod that is formed of a metal such as Cu, for example, and therefore the relative resistances thereof are low and variations in the values thereof are small compared with via conductors that are formed by filling via holes with a conductive paste. Consequently, an inductor can be formed that has excellent coil characteristics (for example, a high Q value) and for which the variations in the characteristics thereof are small.

In addition, the first outer electrode of the electronic component is provided at a position that is superposed with the one end surface of the first metal pin in plan view and the second outer electrode of the electronic component is arranged at a position that is superposed with the one end surface of the second metal pin in plan view. With this configuration, wiring lines that connect the inductor and the electronic component can be shortened, and therefore, the parasitic inductance of the high-frequency circuit can be reduced and the high-frequency component can be reduced in size.

BRIEF DESCRIPTION OF THE SEVERAL VIEWS OF THE DRAWINGS

FIGS. 8A and 8B illustrate a high-frequency component according to a fifth embodiment of the present disclosure.

DETAILED DESCRIPTION

First Embodiment

Figure 1A:
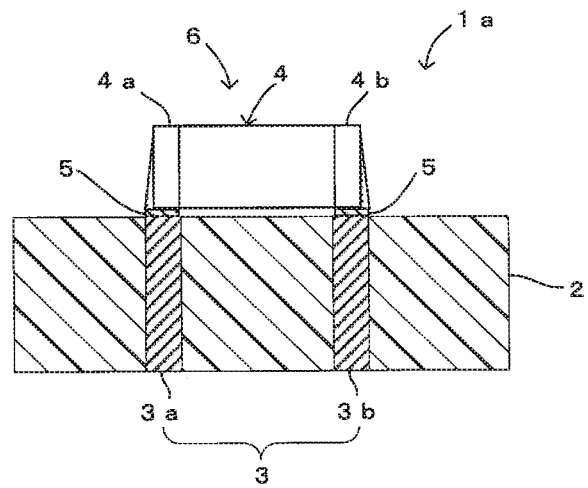
FIGS. 1A-1C illustrate a high-frequency component according to a first embodiment of the present disclosure.

A high-frequency component 1a according to a first embodiment of the present disclosure will be described while referring to FIGS. 1A-1C. FIG. 1A is a sectional view of the high-frequency component 1a, FIG. 1B is a plan view of the high-frequency component 1a, and FIG. 1C is a plan view of the high-frequency component 1a in a state where an electronic component 4 is not mounted.

Figure 1B:
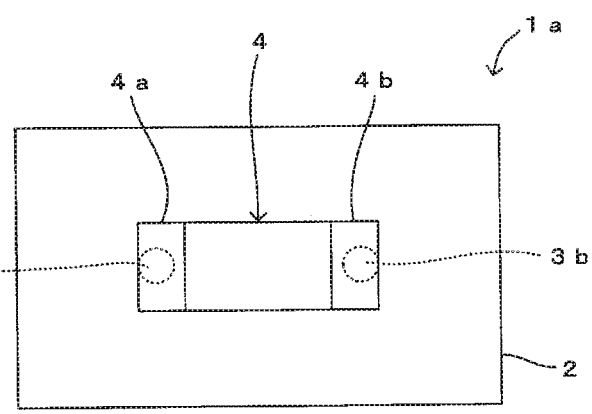
Figure 1C:
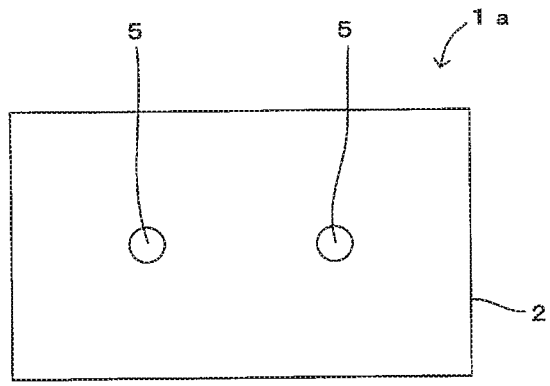

As illustrated in FIGS. 1A to 1C, the high-frequency component 1a according to this embodiment includes a resin layer (corresponds to "insulating layer" of the present disclosure), an inductor 3 and the electronic component 4, which is mounted on an upper surface (one main surface) of the resin layer 2. The high-frequency component 1a is mounted in an electronic device such as a cellular phone, for example.

The resin layer 2 is formed of a magnetic-material-containing resin that is obtained by mixing together an insulating thermally curable resin such as an epoxy resin and a magnetic filler such as ferrite powder, for example.

The inductor 3 includes a first metal pin 3a and a second metal pin 3b. The metal pins 3a and 3b are formed of a metal material such as Cu, a Cu alloy such as a Cu—Ni alloy, or Fe. The metal pins 3a and 3b are each formed in a columnar shape by shearing a wire rod that is formed of any of the above-mentioned metal materials, for example.

The metal pins 3a and 3b are each arranged (buried) inside the resin layer 2 such an upper end surface thereof (corresponds to "one end surface" of the present disclosure) is exposed from the upper surface of the resin layer 2 and a lower end surface thereof (corresponds to "another end surface" of the present disclosure) is exposed from a lower surface of the resin layer 2. At this time, the metal pins 3a and 3b are arranged substantially parallel to each other. In addition, plating films 5 are formed on the upper end surfaces of the metal pins 3a and 3b, and the plating films 5 are used as mounting electrodes for the electronic component 4. The lower end surfaces of the metal pins 3a and 3b are used as external connection electrodes. The plating films 5 may be formed of Ni/Au plating or Cu plating, for example.

The electronic component 4 may be a chip component such as a chip capacitor, a chip inductor or a chip resistor or may be a semiconductor device such as an IC. First and second outer electrodes 4a and 4b are formed on the electronic component 4 as external connection electrodes. The electronic component 4 of this embodiment is a chip capacitor having a rectangular shape in plan view and is arranged such that the first outer electrode 4a and the second outer electrode 4b face each other.

In addition, as illustrated in FIG. 1B, the electronic component 4 is arranged at a position where the first outer electrode 4a and the upper end surface of the first metal pin 3a are superposed with each other in plan view and at a position where the second outer electrode 4b and the upper end surface of the second metal pin 3b are superposed with each other in plan view when the electronic component 4 is arranged on the upper surface of the resin layer 2. The first metal pin 3a and the first outer electrode 4a are connected to each other and the second metal pin 3b and the second outer electrode 4b are connected to each other, and as a result, a high-frequency circuit 6 is formed by the inductor 3 and the electronic component 4. In this embodiment, the high-frequency circuit is formed by connecting the first metal pin 3a, the electronic component 4 and the second metal pin 3b in series with each other.

In this embodiment, pad electrodes for mounting the electronic component 4 are not provided. In other words, the plating films 5, which have substantially the same shape as the upper end surfaces of the metal pins 3a and 3b (circular in plan view in this embodiment), are formed on the upper end surfaces of the metal pins 3a and 3b, and the metal pins 3a and 3b and the outer electrodes 4a and 4b of the electronic component 4 are connected to each other via the plating films 5.

(Method of Manufacturing High-Frequency Component 1a)

Next, a method of manufacturing the high-frequency component 1a will be described while referring to FIGS. 2A-2E. FIGS. 2A-2E illustrate the individual steps of the method of manufacturing the high-frequency component 1a.

Figure 2A:
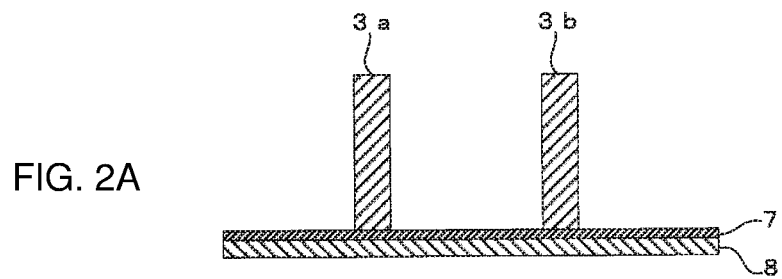
FIGS. 2A-2E are drawings for explaining a method of manufacturing the high-frequency component of FIGS. 1A-1C.

First, a connection plate 8 that has an adhesive layer 7 provided on one main surface thereof is prepared and the metal pins 3a and 3b are arranged on the connection plate 8 (refer to FIG. 2A). At this time, end portions of the metal pins 3a and 3b are affixed to the adhesive layer 7 and the metal pins 3a and 3b are fixed in an upright state to the one main surface of the connection plate 8. In addition, the spacing between the metal pins 3a and 3b will match the spacing between the outer electrodes 4a and 4b of the electronic component 4 after the electronic component 4 is mounted. In other words, the metal pins 3a and 3b are arranged such that the upper end surface of the first metal pin 3a will be superposed with the first outer electrode 4a in plan view and the upper end surface of the second metal pin 3b will be superposed with the second outer electrode 4b in plan view when the electronic component 4 is arranged on the upper surface of the resin layer 2.

Figure 2B:
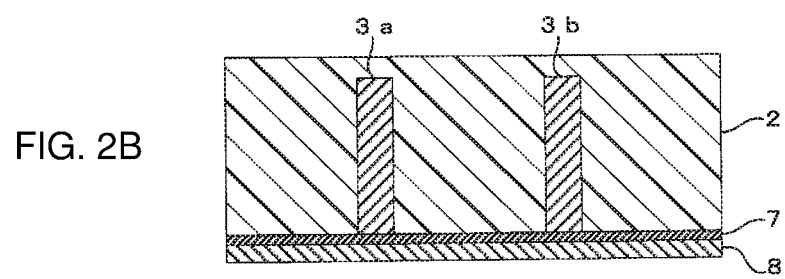

Next, as illustrated in FIG. 2B, the resin layer 2 is stacked on the one main surface of the connection plate 8 such that the metal pins 3a and 3b are buried thereinside. In this embodiment, a magnetic-material-containing resin, which is obtained by adding a magnetic filler to an epoxy resin, is used as the material that forms the resin layer 2, and the resin layer 2 is formed using a coating method, a printing method, a compression molding method or a transfer molding method, for example.

Figure 2C:
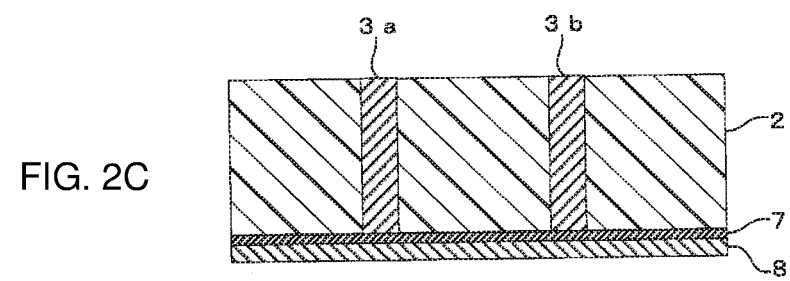

Next, as illustrated in FIG. 2C, the upper end surfaces of the metal pins 3a and 3b are exposed by subjecting the upper side of the resin layer 2 to grinding or abrasion.

Figure 2D:
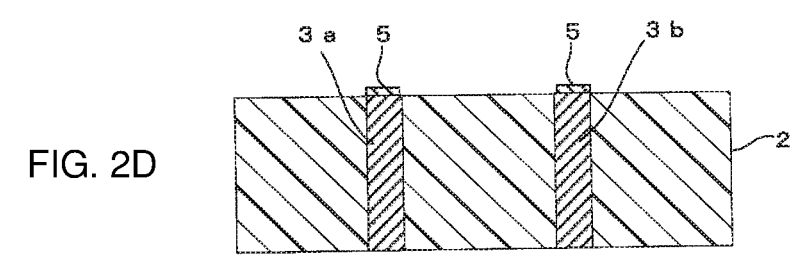

Next, the plating films 5 are formed on the upper end surfaces of the metal pins 3a and 3b, which are exposed from the upper surface of the resin layer 2, and the connection plate 8 is peeled off together with the adhesive layer 7 (refer to FIG. 2D). As a result of the connection plate 8 being peeled off, the lower end surfaces of the metal pins 3a and 3b are exposed from the other main surface of the resin layer 2. The lower surface of the resin layer 2 may be subjected to grinding or abrasion after peeling off the connection plate 8 in order to ensure that the lower end surfaces of the metal pins 3a and 3b are exposed from the resin layer 2.

Figure 2E:
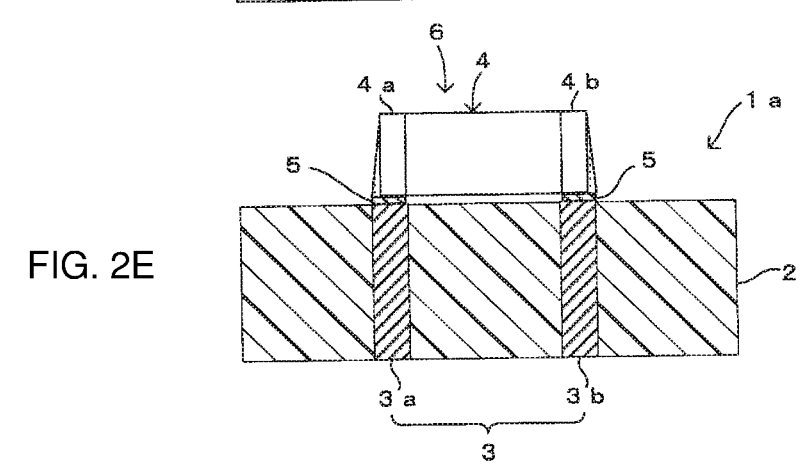

Finally, as illustrated in FIG. 2E, manufacture of the high-frequency component 1a is completed by connecting the upper end surface of the first metal pin 3a and the first outer electrode 4a of the electronic component 4 to each other and connecting the upper end surface of the second metal pin 3b and the second outer electrode 4b of the electronic component 4 to each other. In this embodiment, solder is used to form the connections.

Therefore, according to the above-described embodiment, the inductor 3 is formed of the metal pins 3a and 3b, and consequently, compared with the case of via conductors or through hole conductors, the relative resistance of the inductor 3 can be made low and variations in coil characteristics (for example, Q value) can be reduced. In addition, compared with the case where single columnar conductors are formed by forming via conductors in individual layers and stacking the via conductors on top of one another as in the related art (structure having a large number of resin layers), an increase in or variations in the resistance value of the inductor caused by stacking deviations do not occur since the inductor 3 is formed by burying the metal pins 3a and 3b in the resin layer 2.

In addition, the first outer electrode 4a of the electronic component 4 is arranged at a position that is superposed with the upper end surface of the first metal pin 3a in plan view and is connected to the first metal pin 3a, and the second outer electrode 4b of the electronic component 4 is arranged at a position that is superposed with the upper end surface of the second metal pin 3b in plan view and is connected to the second metal pin 3b. With this configuration, wiring lines that connect the inductor 3 and the electronic component 4 to each other can be shortened, and therefore, the parasitic inductance of the high-frequency circuit 6 can be reduced and the high-frequency component 1a can be reduced in size.

Furthermore, since pad electrodes having a large surface area are not provided on the upper end surfaces of the metal pins 3a and 3b in order to connect the metal pins 3a and 3b and the electronic component 4 to each other as in the related art, a reduction in the size of the high-frequency component 1a can be achieved.

Second Embodiment

Figure 3A:
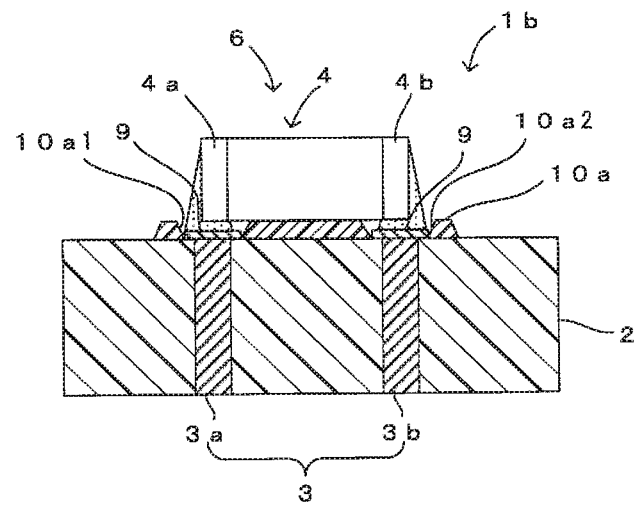
FIGS. 3A-3C illustrate a high-frequency component according to a second embodiment of the present disclosure.

A high-frequency component 1b according to a second embodiment of the present disclosure will be described while referring to FIGS. 3A-3C. FIG. 3A is a sectional view of the high-frequency component 1b, FIG. 3B is a plan view of the high-frequency component 1b, and FIG. 3C is a plan view of the high-frequency component 1b in a state where the electronic component 4 is not mounted.

Figure 3B:
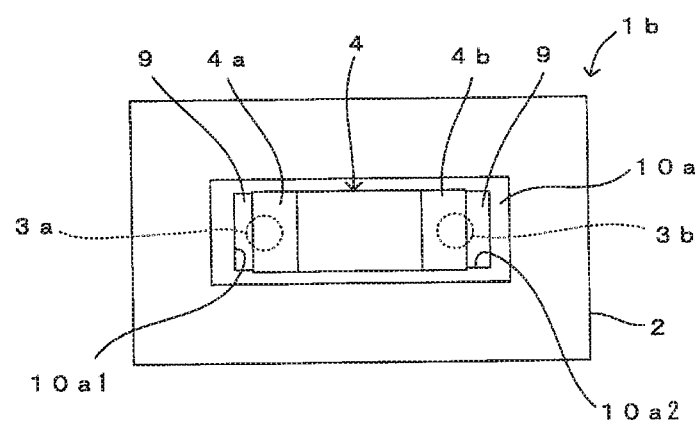
Figure 3C:
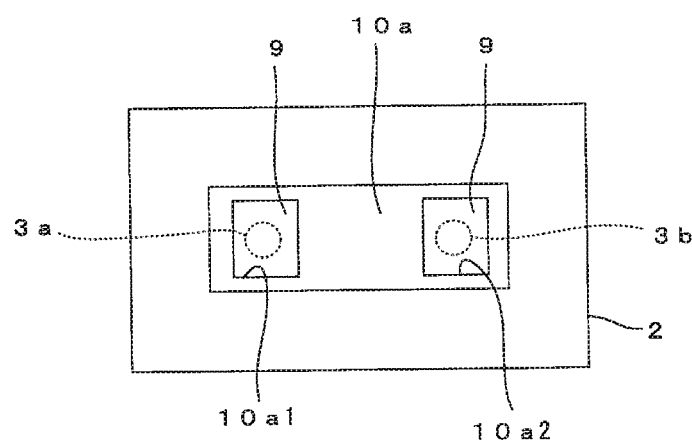

As illustrated in FIGS. 3A-3C, the high-frequency component 1b according to this embodiment differs from the high-frequency component 1a of the first embodiment, which was described while referring to FIGS. 1A-1C, in that pad electrodes 9, which are for mounting the electronic component 4, are formed on the one end surfaces of the metal pins 3a and 3b and a dam member 10a is provided so as to surround the peripheries of the pad electrodes 9. Other parts of the configuration are the same as in the high-frequency component 1a of the first embodiment and therefore those parts are denoted by the same symbols and description thereof is omitted.

In this case, the pad electrodes 9 are formed on the upper end surfaces of the metal pins 3a and 3b, the pad electrodes 9 having larger surface areas than the upper end surfaces of the metal pins 3a and 3b. The pad electrodes 9 are formed by performing plating using the metal component of the upper end surfaces of the metal pins 3a and 3b as a nucleus. The pad electrodes 9 are not limited to being formed of Cu plating and may be instead formed of Ni/Au plating, for example. In addition, the pad electrodes 9 can also be formed using screen printing in which a conductive paste containing a metal such as Cu is used.

The dam member 10a is formed using a resist resin, for example, and functions as a mold member that determines the shapes of the pad electrodes 9.

(Method of Manufacturing High-Frequency Component 1b)

Next, a method of manufacturing the high-frequency component 1b will be described while referring to FIGS. 4A-4D. FIGS. 4A-4D are drawings for explaining the method of manufacturing the high-frequency component 1b, and FIG. 4A-4D illustrate the individual steps of the method.

Figure 4A:
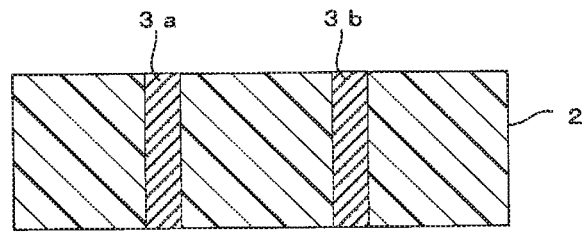
FIGS. 4A-4D are drawings for explaining a method of manufacturing the high-frequency component of FIGS. 3A-3C.

First, as illustrated in FIG. 4A, a body is prepared by burying the metal pins 3a and 3b in the resin layer 2. Up to this point, the high-frequency component 1b is manufactured in substantially the same manner as in the method of manufacturing the high-frequency component 1a of the first embodiment. Specifically, the high-frequency component 1b can be formed in the same manner as in the method of manufacturing the high-frequency component 1a of the first embodiment (FIGS. 2A-2C) in the step of arranging the metal pins 3a and 3b on the connection plate 8, the step of stacking the resin layer 2 on the one main surface of the connection plate 8, up to the step of exposing the upper end surfaces of the metal pins 3a and 3b by subjecting the upper side of the resin layer 2 to grinding or abrasion.

Figure 4B:
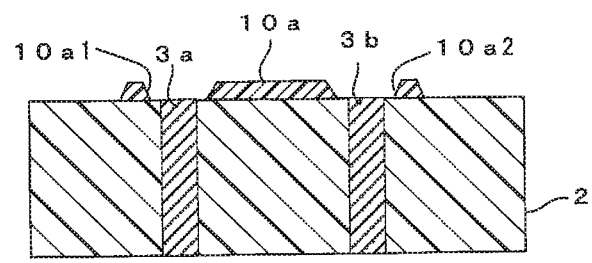

Next, as illustrated in FIG. 4B, the dam member 10a is formed on the upper surface of the resin layer 2. In this embodiment, the dam member 10a is formed by performing screen printing using a resist resin, for example. At this time, the dam member 10a is provided so as to cover a region surrounding the metal pins 3a and 3b and a region between the metal pins 3a and 3b on the upper surface of the resin layer 2. Specifically, openings 10a1 and 10a2 are provided in the dam member 10a at the positions of regions that have been set as regions in which the pad electrodes 9 are to be formed, and with this configuration, the dam member 10a functions as a mold member that determines the shapes of the pad electrodes 9.

Figure 4C:
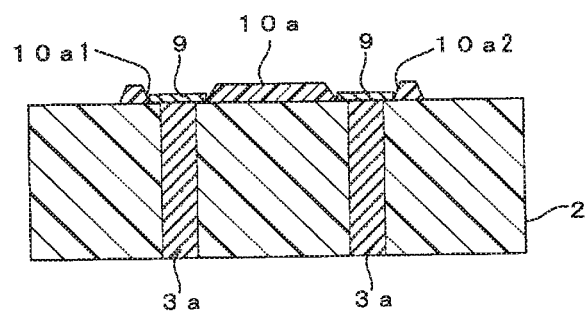

Next, as illustrated in FIG. 4C, the pad electrodes 9 are formed on the upper end surfaces of the metal pins 3a and 3b by performing Cu plating or the like. In the plating process, the metal at the upper end surfaces of the metal pins 3a and 3b is caused to grow as a plating nucleus. Thus, metal films grow so as to fill the openings 10a1 and 10a2 provided in the dam member 10a, and as a result, the pad electrodes 9, which match the shapes of the openings 10a1 and 10a2 in the dam member 10a, are formed.

Figure 4D:
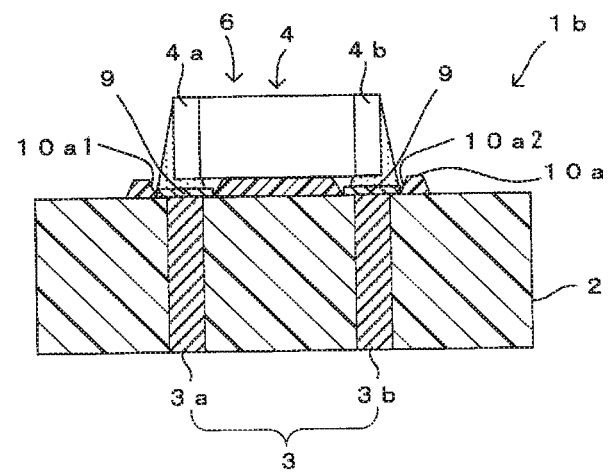

Finally, as illustrated in FIG. 4D, manufacture of the high-frequency component 1b is completed by connecting the pad electrode 9 of the first metal pin 3a and the outer electrode 4a of the electronic component 4 to each other and connecting the pad electrode 9 of the second metal pin 3b and the second outer electrode 4b of the electronic component 4 to each other. Solder is used to form the connections in this embodiment as well.

Therefore, according to the above-described embodiment, the strength of the connections to the electronic component 4 can be improved by providing the pad electrodes 9, which have larger surface areas than the upper end surfaces of the metal pins 3a and 3b. In addition, since the pad electrodes 9 are formed using plating, the resistance of connections to the metal pins 3a and 3b can be reduced compared with a case where the pad electrodes 9 are formed using a conductive paste, for example.

Furthermore, by providing the openings 10a1 and 10a2 in the dam member 10a, not only can the pad electrodes 9 having a desired shape be formed, but short circuiting between the pad electrodes 9 can also be prevented.

Third Embodiment

Figure 5A:
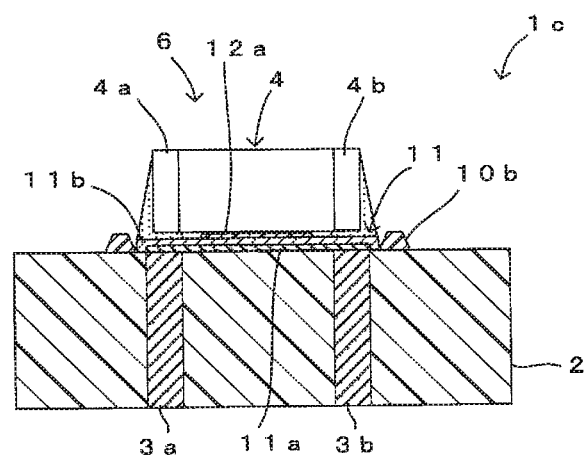
FIGS. 5A and 5B illustrate a high-frequency component according to a third embodiment of the present disclosure.

A high-frequency component 1c according to a third embodiment of the present disclosure will be described while referring to FIGS. 5A and 5B. FIG. 5A is a sectional view of the high-frequency component 1c and FIG. 5B is a plan view of the high-frequency component 1c in a state where the electronic component 4 is not mounted.

Figure 5B:
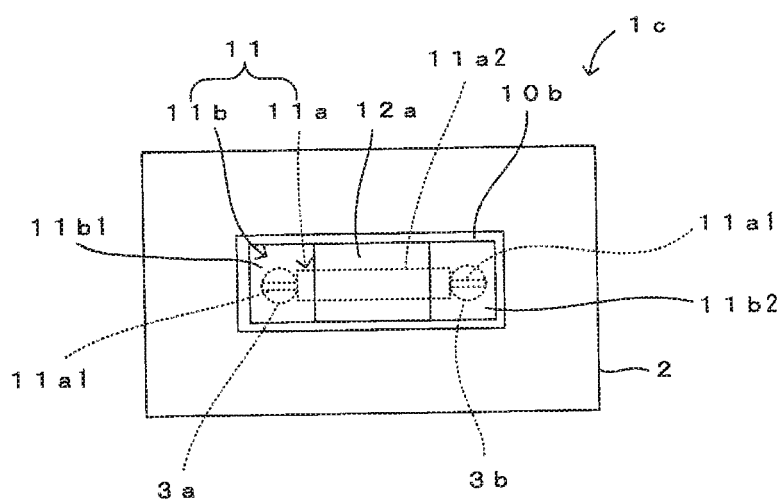

As illustrated in FIGS. 5A and 5B, the high-frequency component 1c according to this embodiment differs from the high-frequency component 1a, which was described while referring to FIGS. 1A-1C, in that a wiring electrode 11 (corresponds to "second wiring electrode" of the present disclosure and may be referred to as second wiring electrode 11 hereafter) that connects the upper end surface of the first metal pin 3a and the upper end surface of the second metal pin 3b to each other is formed on the upper surface of the resin layer 2, in that a dam member 10b that surrounds the periphery of the second wiring electrode 11 is formed on the upper surface of the resin layer 2, and in that an insulating coating film 12a is provided on an upper surface of the second wiring electrode 11. Other parts of the configuration are the same as in the high-frequency component 1a of the first embodiment and therefore those parts are denoted by the same symbols and description thereof is omitted.

In this case, the second wiring electrode 11 is formed of a base electrode 11a that is formed on the upper surface of the resin layer 2 and a surface electrode 11b that is stacked on the base electrode 11a. The base electrode 11a is formed in a line-like shape using a conductive paste that contains a metal such as Cu, and is formed such that the line widths of both end portions 11a1 thereof are smaller than the line width of a remaining part 11a2 of the base electrode 11a. In addition, the base electrode 11a is formed such that the line widths of both the end portions 11a1 thereof are smaller than the maximum width (diameter in this embodiment) of the upper end surfaces of the metal pins 3a and 3b to which the end portions 11a1 are to be connected. Therefore, each of the upper end surfaces of the metal pins 3a and 3b includes a part that is covered by the base electrode 11a and a part that is not covered by the base electrode 11a. In this embodiment, the inductor 3 is formed of the metal pins 3a and 3b and the second wiring electrode 11, and the high-frequency circuit 6 is formed of the inductor 3 and the electronic component 4. In addition, the second wiring electrode 11 and the electronic component 4 are connected in parallel with each other, and the metal pins 3a and 3b are connected in series with the parallel-connected second wiring electrode 11 and electronic component 4.

The surface electrode 11b is formed by performing plating using a metal such as Cu with the metal of the surface of the base electrode 11a and the metal of the upper end surfaces of the metal pins 3a and 3b serving as a plating nucleus. At this time, the surface electrode 11b is provided so as to cover the surface of the base electrode 11a and the parts of the metal pins 3a and 3b that are not covered by the base electrode 11a. Here, parts of the upper surface of the surface electrode 11b are used as connection surfaces to be connected to the outer electrodes 4a and 4b of the electronic component 4. The base electrode 11a may be formed such that both the end portions 11a1 and the remaining part 11a2 thereof have the same line width. In addition, the base electrode 11a may be formed so as to cover the entire upper end surfaces of the metal pins 3a and 3b.

The dam member 10b is, for example, formed using a resist resin, and is formed so as to surround the periphery of the second wiring electrode 11 on the upper surface of the resin layer 2. The dam member 10b functions as a mold member that determines the shape of the surface electrode 11b.

The insulating coating film 12a is formed using a resist resin, for example. In this embodiment, as illustrated in FIG. 5B, regions, which have a rectangular shape in plan view, of both ends of the surface electrode 11b are set as connection regions 11b1 and 11b2 that are to be connected to the outer electrodes 4a and 4b. The insulating coating film 12a is formed so as to cover the entire surface electrode 11b except for the connection regions 11b1 and 11b2 thereof. The insulating coating film 12a is formed in order to adjust the surface areas of the connection surfaces of the surface electrode 11b that are to be connected to the electronic component 4 (first and second outer electrodes 4a and 4b) and in order to prevent short circuiting between the first and second outer electrodes 4a and 4b.

With the above-described configuration, the first outer electrode 4a is connected to the upper end surface of the first metal pin 3a via the connection region 11b1 of the second wiring electrode 11 and the second outer electrode 4b is connected to the upper end surface of the second metal pin 3b via the connection region 11b2 of the second wiring electrode 11.

(Method of Manufacturing High-Frequency Component 1c)

Next, a method of manufacturing the high-frequency component 1c will be described while referring to FIGS. 6A-6E. FIGS. 6A-6E are drawings for explaining the method of manufacturing the high-frequency component 1c, and FIGS. 6A-6E illustrate the individual steps of the method.

Figure 6A:
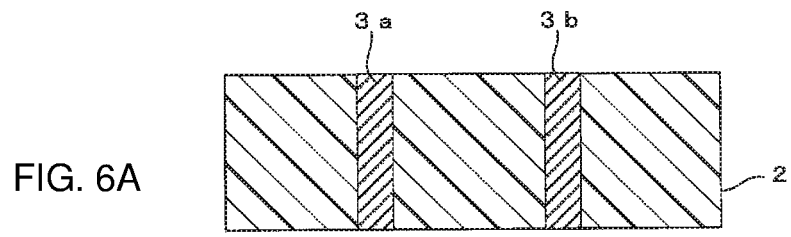
FIGS. 6A-6E are drawings for explaining a method of manufacturing the high-frequency component of FIGS. 5A and 5B.

First, as illustrated in FIG. 6A, a body is prepared by burying the metal pins 3a and 3b in the resin layer 2. Up to this point, the high-frequency component 1c is manufactured in substantially the same manner as in the method of manufacturing the high-frequency component 1a of the first embodiment. Specifically, the high-frequency component 1c can be formed in the same manner as in the method of manufacturing the high-frequency component 1a of the first embodiment (FIGS. 2A-2C) in the step of arranging the metal pins 3a and 3b on the connection plate 8, the step of stacking the resin layer 2 on the one main surface of the connection plate 8, up to the step of exposing the upper end surfaces of the metal pins 3a and 3b by subjecting the upper side of the resin layer 2 to grinding or abrasion.

Figure 6B:
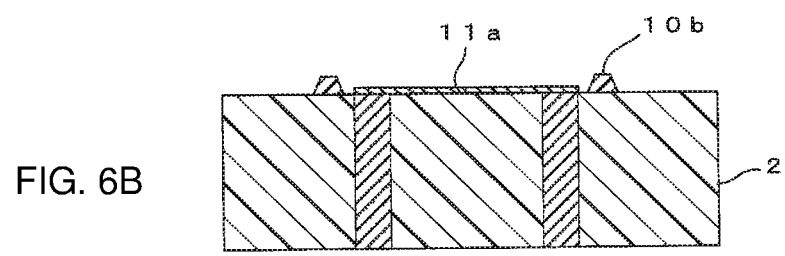

Next, as illustrated in FIG. 6B, the base electrode 11a is formed on the upper surface of the resin layer 2 so as to connect the upper end surfaces of the metal pins 3a and 3b to each other, and after that, the dam member 10b is formed so as to surround a region of the upper surface of the resin layer 2 that has been set as the region in which the surface electrode 11b is to be formed. In this case, the base electrode 11a can be formed by screen printing in which a conductive paste that contains a metal such as Cu is used. In addition, the dam member 10b can be formed by a screen printing method or a dispenser method in which a resist resin is used, for example.

Figure 6C:
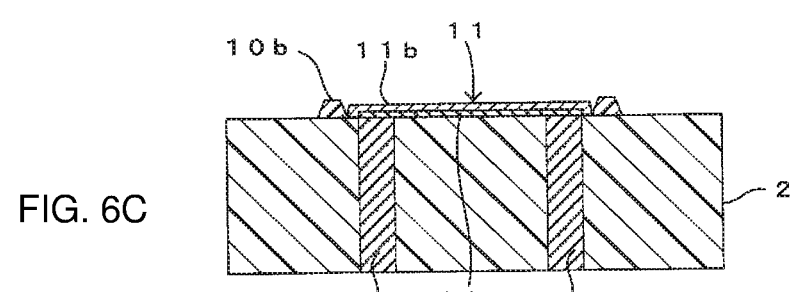

Next, as illustrated in FIG. 6C, the surface electrode 11b, which is composed of a Cu plating film, is formed by using metal components of the surface of the base electrode 11a and the upper end surfaces of the metal pins 3a and 3b (parts not covered by base electrode 11a) as a plating nucleus. At this time, the surface electrode 11b is formed so as to fill the region surrounded by the dam member 10b.

Figure 6D:
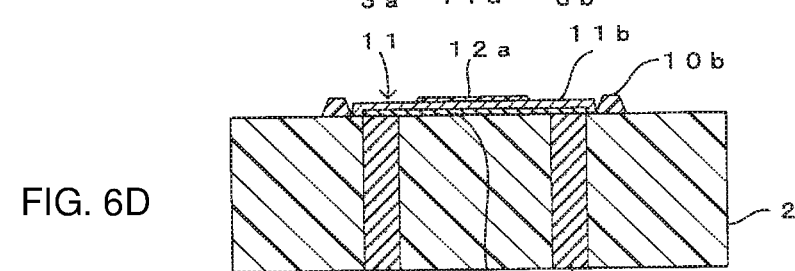

Next, as illustrated in FIG. 6D, the insulating coating film 12a is formed on the upper surface of the surface electrode 11b. The insulating coating film 12a is formed so as to cover a region of the upper surface of the surface electrode 11b except for the connection regions 11b1 and 11b2. The insulating coating film 12a can be formed by performing screen printing using a resist resin, for example.

Figure 6E:
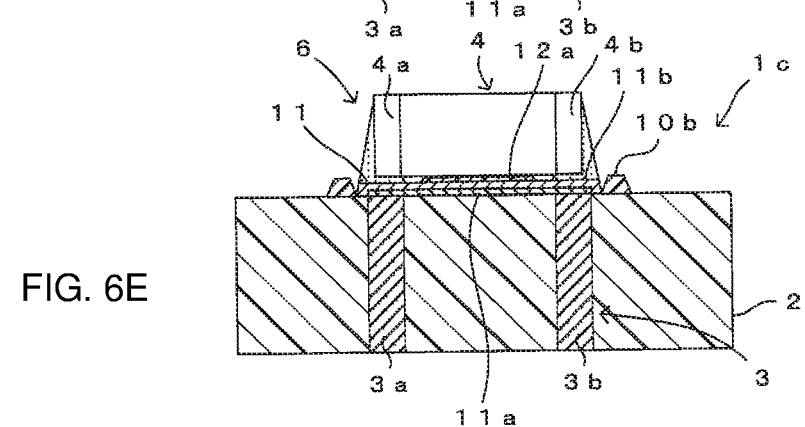

Finally, as illustrated in FIG. 6E, manufacture of the high-frequency component 1c is completed by mounting the electronic component 4 on the surface electrode 11b. In this case, the connection region 11b1 of the surface electrode 11b (refer to FIG. 5B) and the first outer electrode 4a of the electronic component 4 are connected to each other with solder and the connection region 11b2 of the surface electrode 11b (refer to FIG. 5B) and the second outer electrode 4b of the electronic component are connected to each other with solder.

According to this embodiment, in addition to the effect obtained by the high-frequency component 1a of the first embodiment, a high-frequency circuit 6 can be provided in which the inductor 3 and the electronic component 4 are connected in parallel with each other.

Fourth Embodiment

Figure 7A:
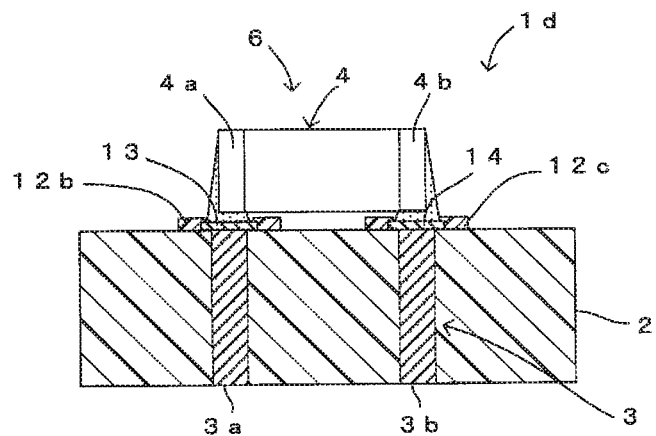
FIGS. 7A-7C illustrate a high-frequency component according to a fourth embodiment of the present disclosure.

A high-frequency component 1d according to a fourth embodiment of the present disclosure will be described while referring to FIGS. 7A-7C. FIG. 7A is a sectional view of the high-frequency component 1d, FIG. 7B is a plan view of the high-frequency component 1d, and FIG. 7C is a plan view of the high-frequency component 1d in a state where the electronic component 4 is not mounted.

Figure 7B:
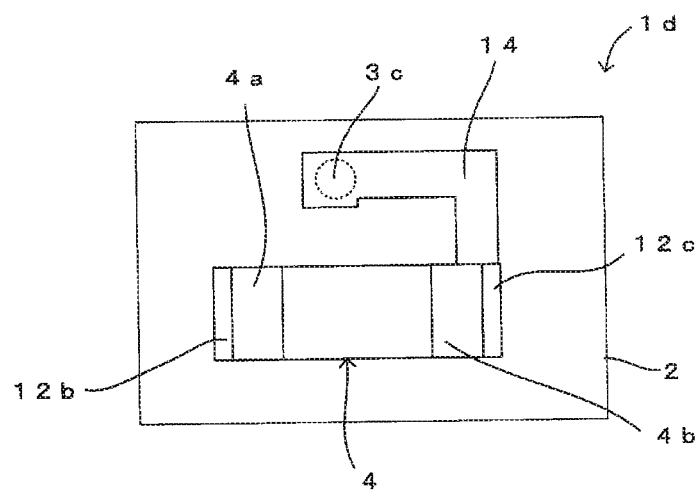
Figure 7C:
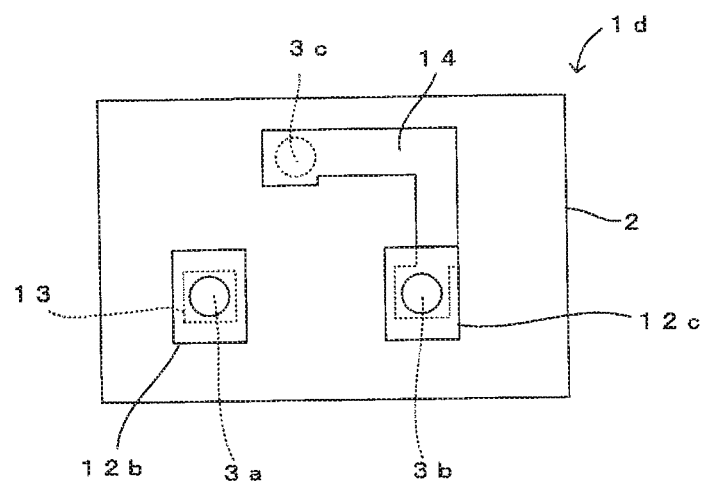

As illustrated in FIGS. 7A-7C, the high-frequency component 1d according to this embodiment differs from the high-frequency component 1a of the first embodiment, which was described while referring to FIGS. 1A-1C, in that a pad electrode 13, which has a larger surface area than the upper end surface of the first metal pin 3a, is formed on the upper end surface of the first metal pin 3a, in that the inductor 3 further includes a third metal pin 3c and a wiring electrode 14 (corresponds to "first wiring electrode" of the present disclosure, and may be referred to as first wiring electrode 14 hereafter) that connects upper end surfaces of the second metal pin 3b and the third metal pin 3c to each other, and in that insulating coating films 12b and 12c are individually provided for the metal pins 3a and 3b, the insulating coating films 12b and 12c being for adjusting the surface areas of the regions of the first metal pin 3a and the second metal pin 3b that are to be connected to the electronic component 4. Other parts of the configuration are the same as in the high-frequency component 1a of the first embodiment and therefore those parts are denoted by the same symbols and description thereof is omitted.

In this case, the pad electrode 13 and the first wiring electrode 14 are formed on the upper surface of the resin layer 2 using screen printing in which a conductive paste containing a metal such as Cu is used, for example. Similarly to the other metal pins 3a and 3b, the third metal pin 3c is arranged (buried) inside the resin layer 2 with the upper end surface of the third metal pin 3c being exposed from the upper surface of the resin layer 2 and the lower end surface of the third metal pin 3c being exposed from the lower surface of the resin layer 2. In addition, the lower end surface of the metal pin 3c is used as an external connection electrode. The third metal pin 3c may be formed of the same material as the other metal pins 3a and 3b.

Furthermore, the third metal pin 3c is arranged at the side of one long edge (long edge on upper side in FIG. 7B) of the electronic component 4, which has a horizontally long rectangular shape in plan view, at a prescribed spacing from the electronic component 4. At this time, the third metal pin 3c is arranged substantially in the middle of the electronic component 4 in the longitudinal direction. The first wiring electrode 14 has a pattern shape that is bent into an L-shape on the upper surface of the resin layer 2, one end thereof being connected to the upper end surface of the second metal pin 3b and the other end thereof being connected to the upper end surface of the third metal pin 3c.

The insulating coating films 12b and 12c are formed of a resist resin, for example. At this time, the insulating coating film 12b is provided so as to cover the periphery of the pad electrode 13 such that the part of the pad electrode 13 that is superposed with the upper end surface of the first metal pin 3a in plan view is exposed. The insulating coating film 12c is provided so as to cover the periphery of one end portion of the first wiring electrode 14 such that the part of the first wiring electrode 14 that is superposed with the upper end surface of the first metal pin 3a in plan view is exposed. With this configuration, the surface area of the region to be connected to the first outer electrode 4a and the surface area of the region to be connected to the second outer electrode 4b can be adjusted to be the same size when connecting the inductor 3 and the electronic component 4 to each other.

Therefore, according to this embodiment, in addition to the effect obtained by the high-frequency component 1a of the first embodiment, a connection structure that allows the electronic component 4 and the inductor 3 to be connected in a variety of ways can be provided. In addition, in this embodiment, "an inductor that is formed of the third metal pin 3c, the first wiring electrode 14 and the second metal pin 3b" and "a circuit that is formed of the first metal pin 3a, the electronic component 4 and the second metal pin 3b" form a circuit by being connected to each other using the second metal pin 3b as a common electrode.

Fifth Embodiment

A high-frequency component 1e according to a fifth embodiment of the present disclosure will be described while referring to FIGS. 8A and 8B. FIG. 8A is a sectional view of the high-frequency component 1e and FIG. 8B is a plan view of the high-frequency component 1e in a state where the electronic component 4 is not mounted.

As illustrated in FIGS. 8A and 8B, the high-frequency component 1e according to this embodiment differs from the high-frequency component 1d of the fourth embodiment, which was described while referring to FIGS. 7A-7C, in that a dam member 10c is provided so as to surround the periphery of the pad electrode 13, in that a dam member 10d is provided so as to surround the periphery of the first wiring electrode 14, in that the surface areas of the parts of the surface of the inductor 3 that are to be connected to the electronic component 4 (first and second outer electrodes 4a and 4b) are adjusted using one insulating coating film 12d, in that the pad electrode 13 is formed by performing plating, and in that the first wiring electrode 14 is formed of a base electrode 14a and a surface electrode 14b. Other parts of the configuration are the same as in the high-frequency component 1d of the fourth embodiment and therefore those parts are denoted by the same symbols and description thereof is omitted.

In this case, the pad electrode 13 is formed by performing Cu plating, for example, so as to fill the region surrounded by the dam member 10c. At this time, the metal of the upper end surface of the first metal pin 3a is used as a plating nucleus. The first wiring electrode 14 has substantially the same configuration as the second wiring electrode 11 of the third embodiment, and is formed of the base electrode 14a, which is formed on the upper surface of the resin layer 2 using a conductive paste that contains a metal such as Cu, and the surface electrode 14b, which is stacked on the base electrode 14a by performing Cu plating or the like. The first wiring electrode 14 is formed so as to fill the region surrounded by the dam member 10d.

The insulating coating film 12d is formed in a strip-like shape on the upper surface of the resin layer 2. At this time, an opening 12d1 is provided in the insulating coating film 12d such that the upper surface of the pad electrode 13 is exposed therethrough and an opening 12d2 is provided in the insulating coating film 12d such that a part 14b1 of the upper surface of the first wiring electrode 14 (upper surface of surface electrode 14b), which has been set as a connection region to be connected to the second outer electrode 4b, is exposed therethrough. The size of the opening 12d2 is set to be the same as that of the upper surface of the pad electrode 13.

(Method of Manufacturing High-Frequency Component 1e)

Next, a method of manufacturing the high-frequency component 1e will be described while referring to FIGS. 9A-9F. FIGS. 9A-9F are drawings for explaining the method of manufacturing the high-frequency component 1e, and FIG. 9A-9F illustrate the individual steps of the method. Since the steps up to when a body in which the first to third metal pins 3a to 3c are arranged inside the resin layer 2 is prepared are the same as for the high-frequency component 1a of the first embodiment, the steps thereafter will be described.

Figure 9A:
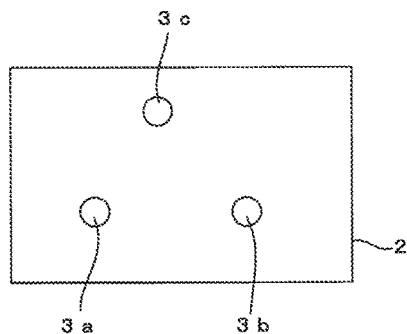
FIGS. 9A-9F are drawings for explaining a method of manufacturing the high-frequency component of FIGS. 8A and 8B.
Figure 9B:
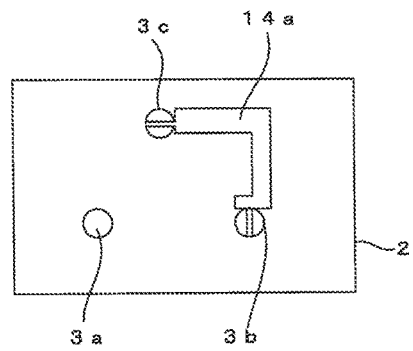

After the first to third metal pins 3a to 3c have been arranged in the resin layer 2 (refer to FIG. 9A), the base electrode 14a, which connects the upper end surfaces of the second metal pin 3b and the third metal pin 3c to each other, is formed on the upper surface of the resin layer 2 (refer to FIG. 9B). In this case, the base electrode 14a is formed substantially in an L-shape, one end thereof is connected to the upper end surface of the second metal pin 3b and the other end thereof is connected to the upper end surface of the third metal pin 3c. In addition, the base electrode 14a is formed such that the line widths of both the end portions thereof are smaller than the maximum width (diameter in this embodiment) of the upper end surfaces of the metal pins 3b and 3c, to which the end portions are to be connected, and the upper end surfaces of the metal pins 3b and 3c include parts that are not covered by the base electrode 14a. In this case, the base electrode 14a can be formed by screen printing in which a conductive paste that contains a metal such as Cu is used, for example.

Figure 9C:
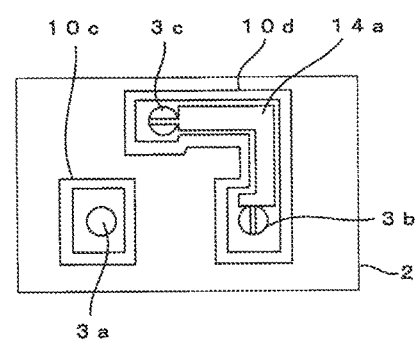

Next, as illustrated in FIG. 9C, the dam member 10c is formed on the upper surface of the resin layer 2 so as to surround the region in which the pad electrode 13 is to be formed, and the dam member 10d is formed on the upper surface of the resin layer 2 so as to surround the region in which the surface electrode 14b is to be formed. The dam members 10c and 10d can be formed by using a printing method or a dispenser method using a resist resin, for example.

Figure 9D:
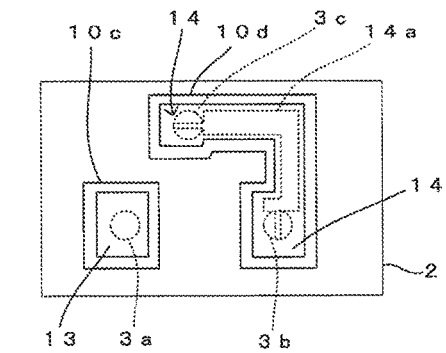

Next, as illustrated in FIG. 9D, the pad electrode 13 and the surface electrode 14b are formed by performing Cu plating. Through the plating process, the pad electrode 13 is formed so as to fill the region surrounded by the dam member 10c and the surface electrode 14b is formed so as to fill the region surrounded by the dam member 10d.

Figure 9E:
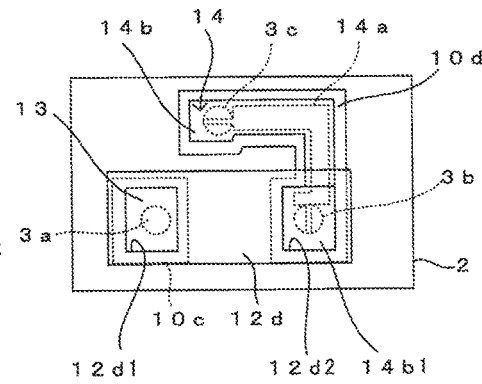

Next, as illustrated in FIG. 9E, the insulating coating film 12d is formed on the upper surface of the resin layer 2 by screen printing in which a resist resin is used, for example. At this time, the opening 12d1 and 12d2, which are for allowing the upper surface of the pad electrode 13 and the region set as the connection region to be exposed therethrough, are provided in the insulating coating film 12d.

Figure 9F:
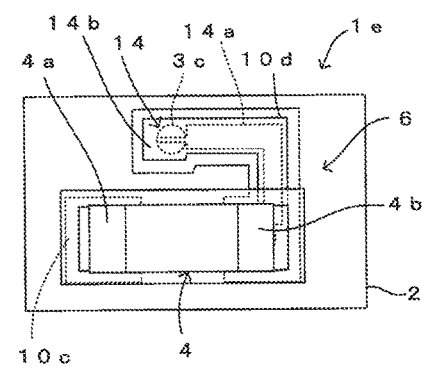

Finally, as illustrated in FIG. 9F, manufacture of the high-frequency component 1e is completed by mounting the electronic component 4 on the upper surface of the resin layer 2. In this case, the pad electrode 13 and the first outer electrode 4a of the electronic component 4 are connected to each other with solder and the part 14b1, which has been set as the connection region to be connected to the outer electrode 4b, of the first wiring electrode 14 is connected to the outer electrode 4b with solder.

According to this embodiment, in addition the effect obtained by the high-frequency component 1d of the fourth embodiment, an effect is obtained that the connection resistance between the first metal pin 3a and the pad electrode 13 and the connection resistance between the first wiring electrode 14 and the second and third metal pins 3b and 3c can be reduced due to the fact that the pad electrode 13 and the surface electrode 14b of the first wiring electrode 14 are formed of plating films, which have a lower relative resistance than a conductive paste.

(Modification of Insulating Coating Film 12d)

Figure 10:
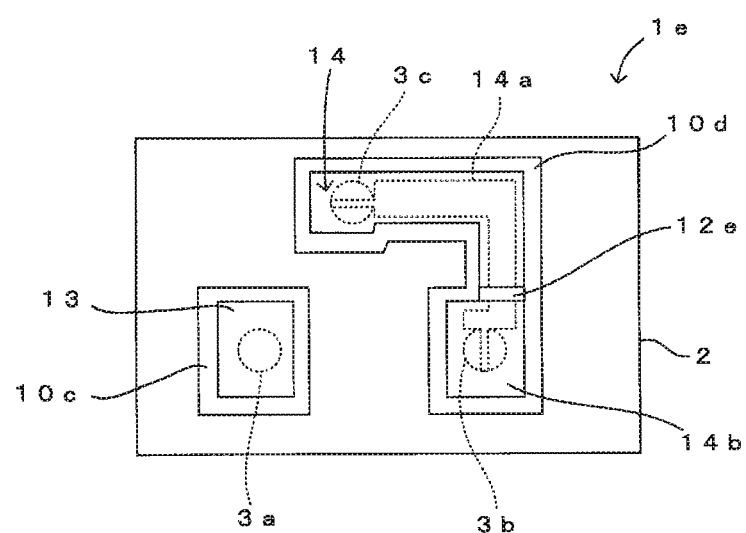
FIG. 10 illustrates a modification of an insulating coating film.

In the high-frequency component 1e of the fifth embodiment described above, a configuration is adopted in which the areas of parts that are to be connected to the outer electrodes 4a and 4b are adjusted by providing the openings 12d1 and 12d2 in the insulating coating film 12d, but, for example, as illustrated in FIG. 10, a configuration may instead be adopted in which the areas of the parts that are to be connected to the outer electrodes 4a and 4b are adjusted using the dam member 10d. Specifically, a connection surface that is be connected to the second outer electrode 4b is formed on the first wiring electrode 14 by using a combination of the part of the dam member 10d that surrounds the periphery of one end of the first wiring electrode 14 (end portion on side connected to second metal pin 3b) and an insulating coating film 12e. In this case, the insulating coating film 12e is arranged such that a region that is rectangular in plan view (connection region to be connected to the second outer electrode 4b) is formed at one end portion of the first wiring electrode 14. With this configuration, the region in which the insulating coating film 12e is formed can be reduced in size and therefore the cost of manufacturing the high-frequency component 1e can be reduced.

Sixth Embodiment

Figure 11:
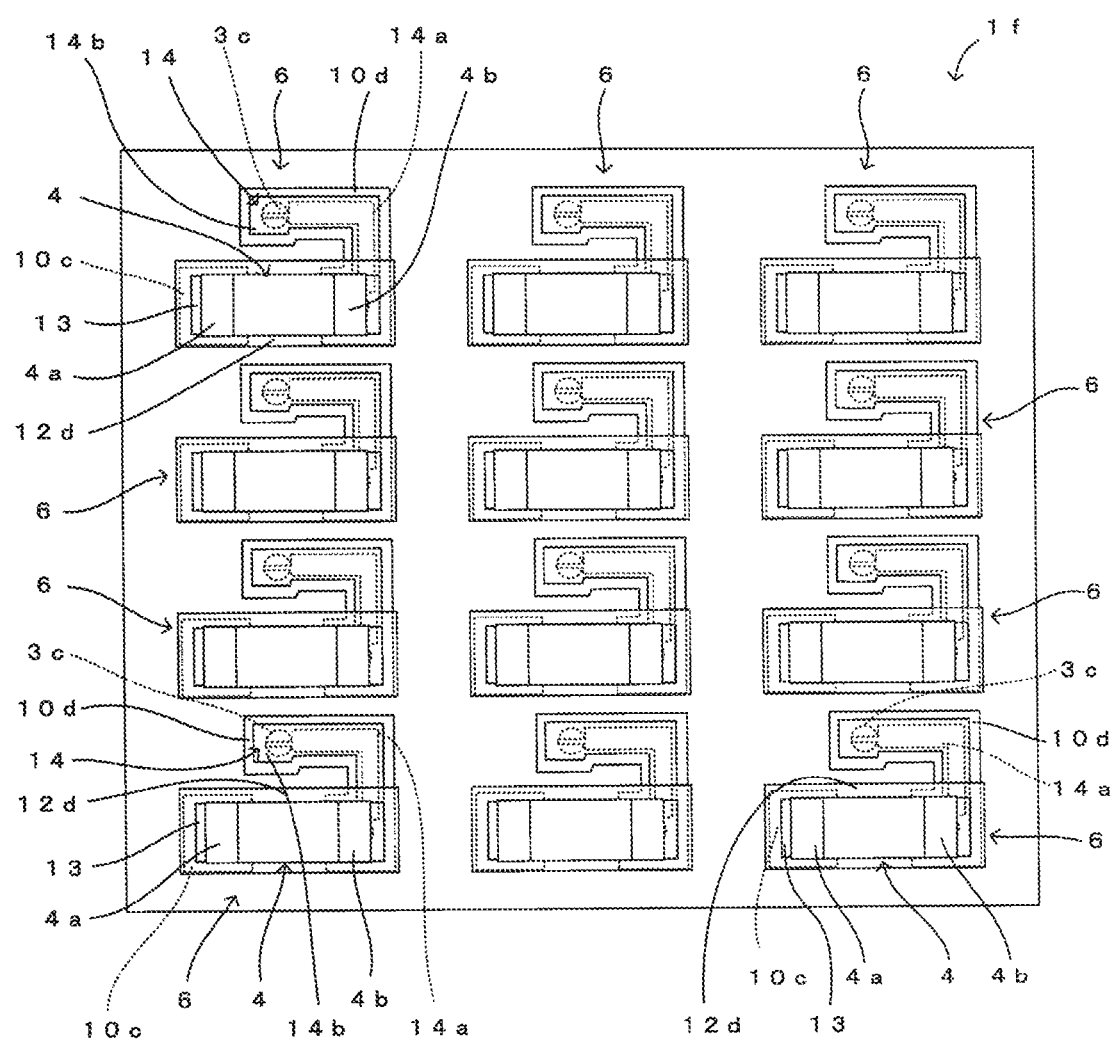
FIG. 11 illustrates a high-frequency component according to a sixth embodiment of the present disclosure.

A high-frequency component 1f according to a sixth embodiment of the present disclosure will be described while referring to FIG. 11. FIG. 11 is a plan view of the high-frequency component 1f.

As illustrated in FIG. 11, the high-frequency component 1f according to this embodiment differs from the high-frequency component 1e of the fifth embodiment, which was described while referring to FIGS. 8A and 8B, in that the high-frequency component 1f includes a plurality of the high-frequency circuits 6. Other parts of the configuration are the same as in the high-frequency component 1e of the fifth embodiment and therefore those parts are denoted by the same symbols and description thereof is omitted.

In this case, the high-frequency component 1f includes a plurality of the high-frequency circuits 6, which each include the high-frequency component 1e of the fifth embodiment, and the high-frequency circuits 6 are arranged in a matrix pattern (four rows×three columns in this embodiment).

With this configuration, an array structure composed of a plurality of the high-frequency circuits 6 can be provided in which the coil characteristics of the inductors 3 are excellent and in which variations in the characteristics of the inductors 3 are small.

Seventh Embodiment

Figure 12:
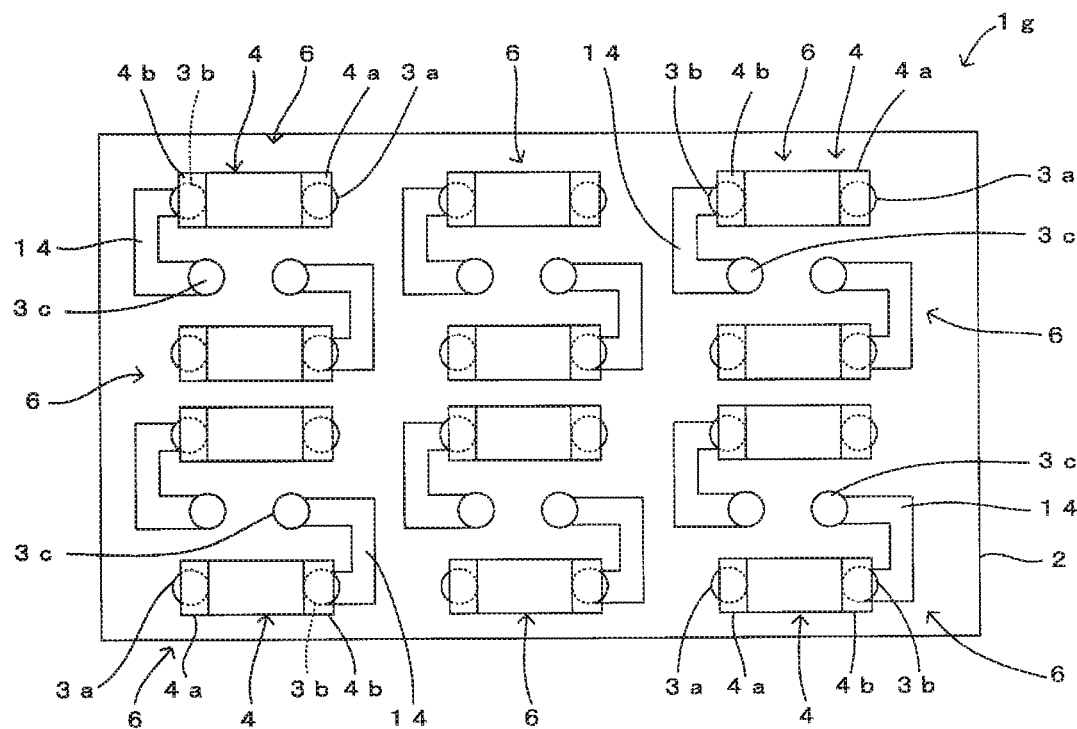
FIG. 12 illustrates a high-frequency component according to a seventh embodiment of the present disclosure.

A high-frequency component 1g according to a seventh embodiment of the present disclosure will be described while referring to FIG. 12. FIG. 12 is a plan view of the high-frequency component 1g.

As illustrated in FIG. 12, the high-frequency component 1g according to this embodiment differs from the high-frequency component 1f of the sixth embodiment, which was described while referring to FIG. 11, in that the structure of the array of the high-frequency circuits 6 is different, and in each high-frequency circuit 6, the dam members 10c and 10d, the pad electrode 13 and the insulating coating film 12d are not provided, the upper end surface of the first metal pin 3a and the first outer electrode 4a of the electronic component 4 are directly connected to each other, the upper end surface of the second metal pin 3b and the second outer electrode 4b of the electronic component 4 are directly connected to each other, and the first wiring electrode 14 is formed of a single-layer structure composed of conductive paste containing a metal such as Cu. Other parts of the configuration are the same as in the high-frequency component 1f of the sixth embodiment and therefore those parts are denoted by the same symbols and description thereof is omitted.

In this case, a large number of sets of two adjacent high-frequency circuits 6 are arrayed in a matrix pattern. Specifically, in this embodiment, two vertically adjacent high-frequency circuits 6 are defined as a set, and these sets are arranged in two rows and three columns. In addition, in each set of high-frequency circuits 6, the two electronic components 4, which each have a rectangular shape in plan view, are arranged parallel to each other, and the upper end surfaces of the two third metal pins 3c are arranged between the two electronic components 4. Therefore, the first wiring electrodes 14, which are each formed so as to be bent substantially in an L-shape from the respective second metal pin 3b, are arranged in the space between the electronic components 4.

With this configuration, the one end surfaces of the third metal pins 3c are arranged between the electronic components 4 of the two high-frequency circuits 6 constituting a set and therefore the space between the electronic components 4 can be efficiently used. Consequently, the high-frequency component 1g, which has an array structure consisting of a plurality of high-frequency circuits 6, can be reduced in size.

Ni/Au plating films may be formed on the upper end surfaces of the first and second metal pins 3a and 3b. In such a case, it would be easy to form solder connections to the electronic components 4. In addition, the first wiring electrodes 14 may be each formed of the base electrode 14a and the surface electrode 14b as in the high-frequency components 1e and 1f of the fifth and sixth embodiments. Furthermore, the dam members 10c and 10d and the insulating coating film 12d may be provided.

Eighth Embodiment

Figure 13:
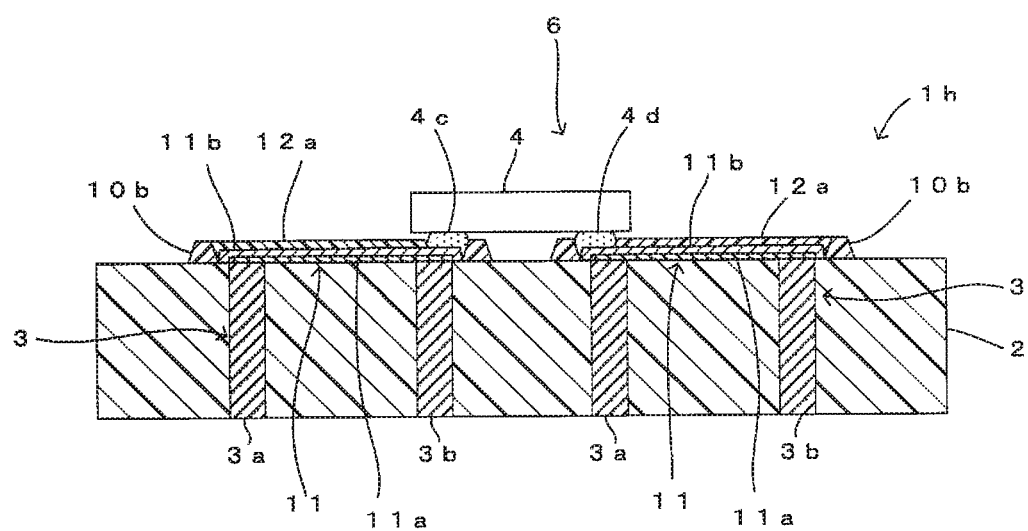
FIG. 13 is a sectional view of a high-frequency module according to an eighth embodiment of the present disclosure.

A high-frequency component 1h according to an eighth embodiment of the present disclosure will be described while referring to FIG. 13. FIG. 13 is a sectional view of the high-frequency component 1h.

As illustrated in FIG. 13, the high-frequency component 1h according to this embodiment differs from the high-frequency component 1c of the third embodiment, which was described while referring to FIGS. 5A and 5B, in that the high-frequency component 1h includes two inductors 3 of the third embodiment, an IC is flip-chip mounted as the electronic component 4, a first outer electrode 4c of the IC is connected to one of the inductors 3, and a second outer electrode 4d of the IC is connected to the other inductor 3. Other parts of the configuration are the same as in the high-frequency component 1c of the third embodiment and therefore those parts are denoted by the same symbols and description thereof is omitted.

In this case, in one of the inductors 3 (on left side in FIG. 13), a region of the upper surface of the surface electrode 11b of the second wiring electrode 11 that is substantially superposed with the upper end surface of the second metal pin 3b is set as a connection region that is to be connected to the first outer electrode 4c of the electronic component 4 and the part of the surface electrode 11b other than this region is covered by the insulating coating film 12a. On the other hand, in the other inductor 3 (on right side in FIG. 13), a region of the upper surface of the surface electrode 11b of the second wiring electrode 11 that is substantially superposed with the upper end surface of the first metal pin 3a is set as a connection region that is to be connected to the second outer electrode 4d of the electronic component 4 and the part of the surface electrode 11b other than this region is covered by the insulating coating film 12a.

With this configuration, inductors 3 can be formed that have excellent coil characteristics (for example, high Q value) and for which the variations in the characteristics thereof are small in the case where the high-frequency circuit 6 is formed of inductors 3 and an IC (electronic component 4). In addition, since the outer electrodes 4c and 4d of the electronic component 4 are arranged at positions that are superposed with the metal pins 3a and 3b in plan view, wiring lines that connect the inductors 3 and the electronic component 4 to each other can be shortened. Therefore, a parasitic inductance of the high-frequency circuit 6 can be reduced and the high-frequency component 1h can be reduced in size.

Ninth Embodiment

Figure 14:
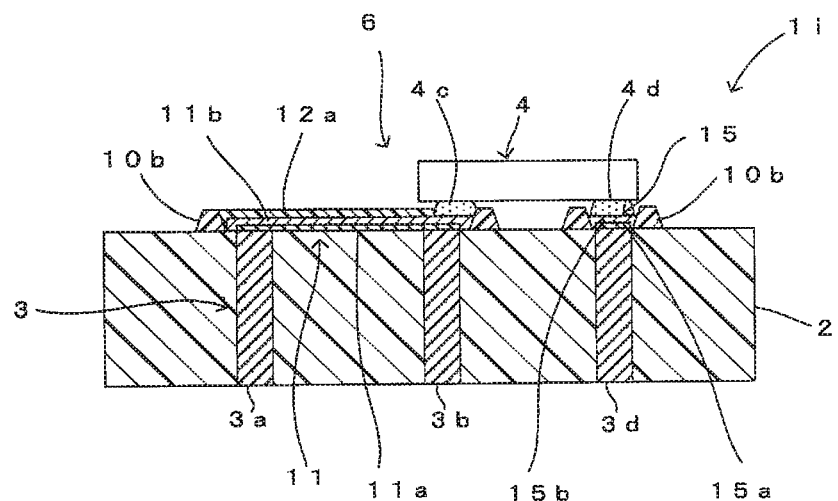
FIG. 14 is a sectional view of a high-frequency module according to a ninth embodiment of the present disclosure.
Figure 15:
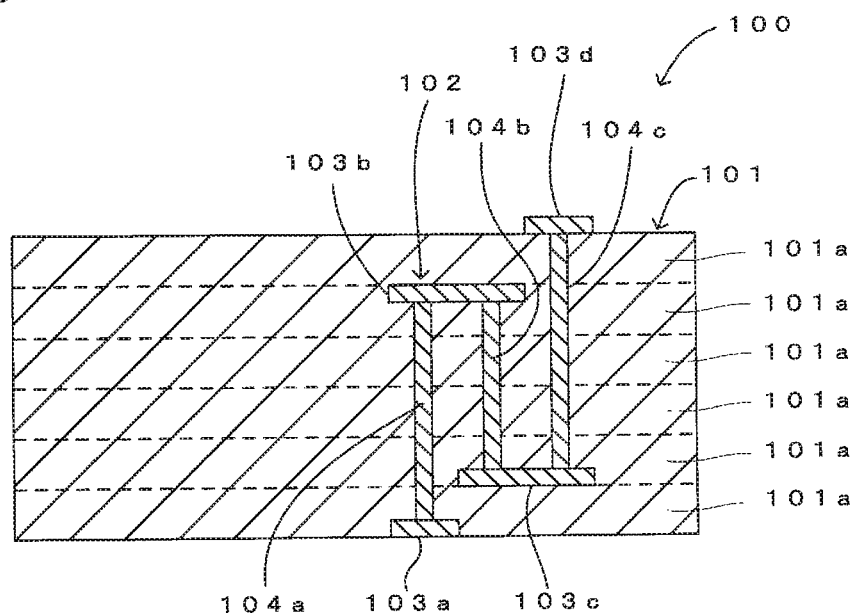
FIG. 15 is a sectional view of a high-frequency component of the related art.

A high-frequency component 1i according to a ninth embodiment of the present disclosure will be described while referring to FIG. 14. FIG. 14 is a sectional view of the high-frequency component 1i.

As illustrated in FIG. 14, the high-frequency component 1i according to this embodiment differs from the high-frequency component 1h of the eighth embodiment, which was described while referring to FIG. 13, in that the other inductor 3 out of the two inductors 3 is formed of a fourth metal pin 3d, and the second outer electrode 4d of the electronic component 4 is connected to the upper end surface of the fourth metal pin 3d. Other parts of the configuration are the same as in the high-frequency component 1h of the eighth embodiment and therefore those parts are denoted by the same symbols and description thereof is omitted.

In this case, the fourth metal pin 3d is arranged (buried) inside the resin layer 2 such that the upper end surface thereof is exposed from the upper surface of the resin layer 2 and the lower end surface thereof is exposed from the lower surface of the resin layer 2. A pad electrode 15 is provided on the upper end surface, and the pad electrode 15 functions as a connection electrode connected to the electronic component 4. In addition, the lower end surface is used as an external connection electrode. The pad electrode 15 is formed of a base electrode 15a, which is formed of a conductive paste, and a surface electrode 15b, which is formed by performing plating.

With this configuration, the same effect as in the eighth embodiment can also be obtained in the high-frequency component 1i in which the electronic component 4 and the inductor 3 are connected via the above-described configuration.

The present disclosure is not limited to the above-described embodiments and can be modified in various ways not described above so long as they do not depart from the gist of the disclosure. For example, a high-frequency component may be formed by combining the configurations of the above-described embodiments.

In addition, although a configuration was adopted in which the base electrode 11a covers part of the upper end surfaces of the metal pins 3a and 3b in the high-frequency component 1b of the second embodiment described above, a configuration may instead be adopted in which the base electrode 11a covers the entirety of the upper end surfaces and a surface electrode 10 is stacked on the base electrode 11a.

In addition, the resin that forms the resin layer 2 does not necessarily have to contain a magnetic filler. Furthermore, a resin layer may additionally formed on the one main surface of the resin layer 2 so as to cover the electronic component 4, the first and second wiring electrodes 14 and 11 and so forth.

INDUSTRIAL APPLICABILITY

In addition, the present disclosure can be broadly applied to a variety of high-frequency components in which a high-frequency circuit is provided in or on a resin layer.

REFERENCE SIGNS LIST 1a to 1i high-frequency component
2 resin layer (insulating layer)
3 inductor
3a first metal pin
3b second metal pin
3c third metal pin
4 electronic component
4a, 4c first outer electrode
4b, 4d second outer electrode
6 high-frequency circuit
11 second wiring electrode
14 first wiring electrode

The invention claimed is:

1. A high-frequency component comprising:
an insulating layer; and
a high-frequency circuit including an inductor and an electronic component that is arranged on one main surface of the insulating layer;
wherein the inductor includes
a first metal pin that is provided such that one end surface thereof is exposed from the one main surface of the insulating layer and another end surface thereof is exposed from another main surface of the insulating layer,
a second metal pin that is provided such that one end surface thereof is exposed from the one main surface of the insulating layer and another end surface thereof is exposed from the other main surface of the insulating layer,
a third metal pin that is provided such that one end surface thereof is exposed from the one main surface of the insulating layer and another end surface thereof is exposed from the other main surface of the insulating layer, and
a first wiring electrode that is provided on the one main surface of the insulating layer and connects the one end surface of the second metal pin and the one end surface of the third metal pin to each other, and
the electronic component has a first outer electrode that is provided at a position that is superposed with the one end surface of the first metal pin in plan view and is connected to the first metal pin, and a second outer electrode that is provided at a position that is superposed with the one end surface of the second metal pin in plan view and is connected to the second metal pin.

2. The high-frequency component according to claim 1, wherein the inductor further includes
a second wiring electrode that is provided on the one main surface of the insulating layer and connects the one end surface of the first metal pin and the one end surface of the second metal pin to each other, and
the first outer electrode is connected to the one end surface of the first metal pin via the second wiring electrode, and
the second outer electrode is connected to the one end surface of the second metal pin via the second wiring electrode.

3. The high-frequency component according to claim 1, comprising:
a plurality of the high-frequency circuits;
wherein the high-frequency circuits are arrayed in a matrix pattern.

4. A high-frequency component comprising:
an insulating layer;
a plurality of the high-frequency circuits, each including an inductor and an electronic component that is arranged on one main surface of the insulating layer,
wherein each electronic component comprises a chip component having a rectangular shape in plan view,
wherein each inductor includes:
a first metal pin that is provided such that one end surface thereof is exposed from the one main surface of the insulating layer and another end surface thereof is exposed from another main surface of the insulating layer,
a second metal pin that is provided such that one end surface thereof is exposed from the one main surface of the insulating layer and another end surface thereof is exposed from the other main surface of the insulating layer,
a third metal pin that is provided such that one end surface thereof is exposed from the one main surface of the insulating layer and the another end surface thereof is exposed from the other main surface of the insulating layer, and
a first wiring electrode that is provided on the one main surface of the insulating layer and connects the one end surface of the second metal pin and the one end surface of the third metal pin to each other,
wherein the electronic component has a first outer electrode that is provided at a position that is superposed with the one end surface of the first metal pin in plan view and is connected to the first metal pin, and a second outer electrode that is provided at a position that is superposed with the one end surface of the second metal pin in plan view and is connected to the second metal pin,
wherein a large number of sets of two adjacent high frequency circuits of the plurality of high-frequency circuits are arrayed in a matrix pattern, and
wherein in each set of two adjacent high-frequency circuits, the corresponding electronic components are arranged parallel to each other, and the one end surfaces of two of the third metal pins are arranged between the corresponding electronic components.

5. The high-frequency component according to claim 2, comprising:
a plurality of the high-frequency circuits;
wherein the high-frequency circuits are arrayed in a matrix pattern.

* * * * *